United States Patent [19]

Ohkubo et al.

[11] Patent Number: 5,492,860
[45] Date of Patent: Feb. 20, 1996

[54] METHOD FOR GROWING COMPOUND SEMICONDUCTOR LAYERS

[75] Inventors: Satoshi Ohkubo; Shinji Miyagaki, both of Kawasaki, Japan

[73] Assignee: Fujitsu Limited, Kawasaki, Japan

[21] Appl. No.: 47,202

[22] Filed: Apr. 16, 1993

[30] Foreign Application Priority Data

Apr. 17, 1992 [JP] Japan ................................ 4-097990
Jun. 4, 1992 [JP] Japan ................................ 4-168257
Jun. 29, 1992 [JP] Japan ................................ 4-170604

[51] Int. Cl.$^6$ ................................................ H01L 21/20
[52] U.S. Cl. .......................... 437/133; 117/89; 117/92; 437/107; 437/946; 148/DIG. 17
[58] Field of Search ................................ 437/133, 107, 437/946; 148/DIG. 17; 156/612; 117/89, 92

[56] References Cited

U.S. PATENT DOCUMENTS

| 4,579,609 | 4/1986 | Reif et al. ................... 437/946 |
| 4,824,518 | 4/1989 | Hayakawa et al. . |
| 4,925,810 | 5/1990 | Kano et al. ................... 437/105 |
| 4,975,388 | 12/1990 | Guedon et al. ................ 437/133 |
| 5,168,077 | 12/1992 | Ashizawa et al. .............. 437/946 |
| 5,252,512 | 10/1993 | Shuskus et al. ................ 437/81 |

FOREIGN PATENT DOCUMENTS

| 175690 | 7/1990 | Japan . |
| 4-7819A | 1/1992 | Japan . |
| 4-14214A | 1/1992 | Japan . |

OTHER PUBLICATIONS

S. Nozaki, et al. "Effects of Growth Temperature and V/III Ratio on MOCVD-Grown GaAs-on-Si" Jap. Journal of Appl. Phys. vol. 29, No. 1 pp. 138–144 (1990).

G. Strauch, et al. "Production of High Resistivity GaAs Buffer Layers by LP-MOCVD" Semi-Insulating III–V Materials: Proc. of the 6th Conf., Adam Ailger, pp. 89–94 (1990) (abs only).

R. Bhat, "OMCVD Growth of GaAs and AlGaAs Using a Solid As Source" J. Electron Mater. vol. 14, No. 4 pp. 433–449 Jul. 1985 (Abs. only).

M. Yoshida, et al "GaAs Growth Using TMG and AsCl$_3$," J. Electrochem Soc. vol. 132, No. 4 pp. 930–932 (Apr. 1985). (Abstract only).

Primary Examiner—R. Bruce Breneman
Assistant Examiner—Linda J. Fleck
Attorney, Agent, or Firm—Staas & Halsey

[57] ABSTRACT

A method of growing a layer of a III-V compound semiconductor on a silicon substrate comprises an oxide layer removing step of removing an oxide layer on a surface of the silicon substrate at a first temperature, a low-temperature grown layer forming step of forming a low-temperature grown layer of the III-V compound semiconductor on the silicon substrate while introducing a source gas for Group III and a source gas for Group V at a second temperature lower than the first temperature, and a single crystal layer growing step of growing a single crystal layer of the Group III-V compound semiconductor on the low-temperature grown layer while introducing the source gas for Group III and the source gas for Group V at a third temperature higher than the second temperature and lower than the first temperature. The introduction of the source gas for Group V being started between the oxide layer removing step and the low-temperature grown layer forming step and at a predetermined temperature lower than the first temperature and higher than the third temperature, at which the first temperature arrives while being lowered to the second temperature. The surface of a silicone substrate is prevented from contamination before the formation of the low-temperature grown layer. A III-V compound semiconductor layer which is superior in crystal perfection and surface morphology can be formed.

20 Claims, 16 Drawing Sheets

PRESENT INVENTION

FIG. 5

AsH₃ INTRODUCTION TEMPERATURE

1000°C — I
750°C — II

950°C — I
700°C — II

900°C — I (OPAQUE)
650°C — II

850°C — I with II regions (OPAQUE LINE)
600°C — II with I regions

800°C — II
550°C — I

PRESENT INVENTION

A : 2-STEP GROWTH (GROWTH TEMP.: 650°C)
B : 2-STEP GROWTH (GROWTH TEMP.: 700°C)
C : 4-STEP GROWTH

A : 2-STEP GROWTH (GROWTH TEMP.: 650°C)
B : 2-STEP GROWTH (GROWTH TEMP.: 700°C)
C : 4-STEP GROWTH

FIG. 16

| | SOURCE GAS FOR GROUP V | INTRODUCTION TEMP. OF SOURCE GAS | GROWING TEMP. OF LOW-TEMPERATURE GROWN LAYER | CRYSTAL PERFECTION (FULL WIDTH AT HALF MAXIMUM OF X-RAY LOCKING CURVE BY X-RAY DEFLECTION METHOD) | | SURFACE ROUGHNESS (ROOT MEAN SQUARE OF ROUGHNESS BY AFM) | |
|---|---|---|---|---|---|---|---|
| COMPARATIVE EXAMPLE 1 | AsH₃ | 450°C | 450°C | 240" | ◯ | 10.0 nm | × |
| EXAMPLE 1 | AsH₃ | 400°C | 400°C | 230" | ◯ | 5.0 nm | ◯ |
| COMPARATIVE EXAMPLE 2 | TBAs | 450°C | 450°C | 267" | ◯ | 21.9 nm | × |
| EXAMPLE 2 | TBAs | 400°C | 400°C | 244" | ◯ | 3.8 nm | ◯ |
| EXAMPLE 3 | TBAs | 350°C | 350°C | 236" | ◯ | 3.8 nm | ◯ |

METHOD FOR GROWING COMPOUND SEMICONDUCTOR LAYERS

BACKGROUND OF THE INVENTION

The present invention relates to a method of growing of Group III-V compound semiconductor crystal layers on a silicon substrate, particularly to a method of growing a layer of Group III-V compound semiconductor crystal, which can have good perfection and surface morphology.

Recently compound semiconductor devices, such as FETs, etc., using Group III-V compound semiconductor such as GaAs, etc., in place of silicon materials have been noted.

In the fabrication of compound semiconductor devices, generally compound semiconductor crystal layers are grown on compound semiconductor substrates. Recently crystal growing methods for growing crystal layers of Group III-V compound semiconductors, such as GaAs, on silicon substrates have been much studied and developed. Silicon substrates have low production costs, and large-diameter silicon substrates can be easily produced and have good strength. If the compound semiconductor layers can be formed on large-diameter silicon substrates, they will yield a large number of compound semiconductor devices.

For the growth of compound semiconductor crystal such as GaAs, on silicon substrates is required a method of growing compound semiconductor crystal layers on silicon substrates, which can form good Group IXI-V compound semiconductor crystal layers having good crystal perfection and surface morphology.

As a conventional method of growing Group III-V compound semiconductor crystals on silicon substrates is known a method in which a silicon substrate is heat-treated in an ambient atmosphere of a reducing gas and a source gas for Group V, subsequently a low-temperature grown layer of a Group III-V compound semiconductor is first formed at a low temperature on the silicon substrate, and then a layer of the Group III-V compound semiconductor is epitaxially grown on the low-temperature grown layer.

But in the conventional method, when a Group III-V compound semiconductor layer is grown on a silicon substrate offset from (100) plane in [011] direction, the longitudinal axes of the etch pits formed by KOH treatment of a grown compound semiconductor layer are normal to the offset direction. It is known from phenomena that in the case that the longitudinal axes of the etch pits in the compound semiconductor layer on the thus-offset silicon substrate are normal to the offset direction, the grown compound semiconductor layer is inferior in surface morphology and crystal perfection. Thus, the conventional method cannot produce compound semiconductor layers having good surface morphology and crystal perfection.

As a method for solving the problem of the above-described conventional method is proposed a method described in Japanese Patent Laid-Open Publication No. 175690/1990. In this method, after a substrate is heat-treated in a reducing gas, a source gas for Group V is for the first time introduced to form a low temperature grown layer of a III-V compound semiconductor at a low temperature, and then a layer of the III-V compound semiconductor epitaxially grown on the low-temperature grown layer.

In comparison with the conventional method, this method improves the crystal perfection of the grown compound semiconductor layers.

But the method described in Japanese Patent Laid-Open Publication No. 175690/1990 has the problem that although the crystal perfection of the grown compound semiconductor layers is improved, the surface of the silicon substrate is contaminated in the heat treatment in a reducing gas atmosphere before the low-temperature grown layer is formed, which results in inferior surface morphology of the grown compound semiconductor layer.

The above-described conventional methods for growing compound semiconductor crystal layers have the problems that a large number of pits are appear on the as-grown surface of the compound semiconductor epitaxial layer, and the surface is rough and not flat, and the growth at a high temperature decreases pits on the as-grown surface, but raises a carrier concentration.

An object of the present invention is to provide a method of growing a compound semiconductor layer which can form on a silicon substrate a Group III-V compound semiconductor layer having good crystal perfection and surface morphology.

SUMMARY OF THE INVENTION

The above-described object of the present invention is achieved by a method of growing a layer of a III-V compound semiconductor on a silicon substrate comprising: an oxide layer removing step of removing an oxide layer on a surface of the silicon substrate at a first temperature; a low-temperature grown layer forming step of forming a low-temperature grown layer of the III-V compound semiconductor on the silicon substrate while introducing a source gas for Group III and a source gas for Group V at a second temperature lower than the first temperature; and a single crystal layer growing step of growing a single crystal layer of the Group III-V compound semiconductor on the low-temperature grown layer while introducing the source gas for Group III and the source gas for Group V at a third temperature higher than the second temperature and lower than the first temperature, the introduction of the source gas for Group V being started between the oxide layer removing step and the low-temperature grown layer forming step and at a predetermined temperature lower than the first temperature and higher than the third temperature, at which the first temperature arrives while being lowered to the second temperature.

It is preferable that the predetermined temperature for the source gas for Group V to be introduced at is above about 650° C. and below about 800° C.

It is preferable that the first temperature is above about 950° C. and below about 1050° C., the second temperature is above about 350° C. and below about 500° C., and the third temperature is above about 600° C. and below about 750° C.

According to the present invention, the introduction of the V gas is started between the first oxide layer removing step and the second low-temperature grown layer forming step and at a predetermined temperature lower than the first temperature and higher than the third temperature, at which the first temperature arrives while being lowered to the second temperature. The surface of a silicone substrate is prevented from contamination before the formation of the low-temperature grown layer. A III-V compound semiconductor layer which is superior in crystal perfection and surface morphology can be formed.

The above-described object of the present invention is achieved by a method of growing a layer of a Group III-V compound semiconductor on a silicon substrate comprising: an oxide layer removing step of removing an oxide layer on a surface of the silicon substrate at a first temperature; a low-temperature grown layer forming step of forming a low-temperature grown layer of the Group III-V compound semiconductor on the silicon substrate while introducing a source gas for Group III and a source gas for Group V at a second temperature lower than the first temperature; a first single crystal layer growing step of growing a first single crystal layer of the Group III-V compound semiconductor on the low-temperature grown layer while introducing the source gas for Group V and the source gas for Group V at a third temperature higher than the second temperature and lower than the first temperature; a second single crystal layer growing step of growing a second single crystal layer of the Group III-V compound semiconductor on the first single crystal layer while introducing the source gas for Group V and the source gas for Group V at a fourth temperature higher than the third temperature and lower than the first temperature; and a third single crystal layer growing step of growing a third single crystal layer of the Group III-V compound semiconductor on the second single crystal layer while introducing the source gas for Group V and the source gas for Group V at a fifth temperature higher than the second temperature and lower than the fourth temperature.

It is preferable that the third temperature is above about 600° C. and below 700° C., the fourth temperature is above about 700° C., and the fifth temperature is about below 700° C.

It is preferable that a V/III ratio which is a flow rate ratio of the source gas for Group V to the source gas for Group III in the first single crystal layer forming step is lower than a V/III ratio which flow rate ratios of the source gas for Group V to the source gas for Group III in the second and the third single crystal growing steps.

According to the present invention, the first single crystal layer of the Group III-V compound semiconductor is formed on the low-temperature grown layer at a relatively low temperature. The agglomeration of growth nuclei of the compound semiconductor, the so-called corescence, can be precluded. The second single crystal layer is formed on the first single crystal layer at a higher temperature. Pits which appear on the as-grown surface are precluded, and improved smoothness can be achieved. When the second single crystal layer is formed at a higher temperature, a carrier concentration is increased. The formation of the third single crystal layer on the second single crystal layer at a relatively low temperature can suppress increases of the carrier concentration.

A V/III ratio which is a flow rate ratio of the source gas for Group V to the source gas for Group III in the first single crystal layer forming step is lower than a V/III ratio which flow rate ratios between the source gas for Group V to the source gas for Group III in the second and the third single crystal growing steps. Pits on the as-grown surface can be reduced.

The object of the present invention is achieved by a method of growing a layer of a Group III-V compound semiconductor on a silicon substrate comprising: an oxide layer removing step of removing an oxide layer on a surface of the silicon substrate at a first temperature; a low-temperature grown layer forming step of forming a low-temperature grown layer of the III-V compound semiconductor on the silicon substrate while lowering the first temperature to a second temperature lower of below about 400° C., then starting an introduction of a source gas for Group V, and subsequently starting additionally an introduction of a source gas for Group III; and a single crystal layer growing step of growing a single crystal layer of the Group III-V compound semiconductor on the low-temperature grown layer at a third temperature higher than the second temperature and lower than the first temperature while introducing the source gas for Group V and the source gas for Group III.

It is preferable that the third temperature is above about 600° C. and below about 750° C.

It is preferable that the oxide layer removing step is conducted in a first reactor, and the low-temperature grown layer forming step and the single crystal layer forming step are conducted in a second reactor.

Materials of the low-temperature grown layer and the single crystal layers are exemplified by GaAs, AlAs, AlGaAs, GaAsP or other. Combinations of the single crystal layer and the low-temperature grown layer are exemplified by GaAs/GaAs, GaAs/AlAs, GaAs/AlGaAs, GaAs/GaAsP, etc. It is preferable that the low-temperature grown layer contains Al because it stabilizes the two-dimensional growth. The source gas for Group V is exemplified by arsine, tertiarybutylarsine, ethylarsine, etc.

In the present invention, the upper limit temperature for growing the low-temperature grown layer is set at 400° C. so as to prevent the surface of the silicon substrate from being roughed. That is, the source gas for Group V is not introduced during the high-temperature heat-treatment, because the source gas for Group V introduced during the high-temperature heat-treatment, because active hydrogen generated by the deposition roughs the substrate surface, which affects the crystal perfection and surface morphology of the single crystal grown thereon.

According to the present invention, the lower limit of the third temperature for the single crystal layer to be grown at is set about 600° C. Below about 600° C. the compound is not singlecrystallized but poly-crystallized, and unpreferably single crystal layer of poor layer quality is formed. According to the present invention, the upper limit of the third temperature for the single crystal layer to be formed at is set at about 750° C. Above 750° C., the growth rate lowers, and unpreferably the surface becomes rough, and surface morphology is poor.

According to the present invention, the oxide layer removing step is conducted in the first reactor, and the low-temperature grown layer forming step and the single crystal layer growing step are conducted in the second reactor. The substrate surface is precluded from the contamination and roughing by the active hydrogen and active arsenic generated by the decomposition.

BRIEF DESCRIPTION OF THE DRAWINGS

FIG. 5 is views of crystal states of the GaAs layer corresponding to different temperatures at the introduction of $AsH_3$, which is a Group V gas;

FIG. 16 is a table of measured crystal perfection and surface smoothness of the GaAs single crystal layer corresponding to different source gasses for Group V, different introduction temperatures of the source gasses for Group V and different growth temperatures of the low-temperature grown layers in the third embodiment of the present invention;

DETAILED DESCRIPTION OF THE INVENTION

1. A first embodiment

Figure 1:
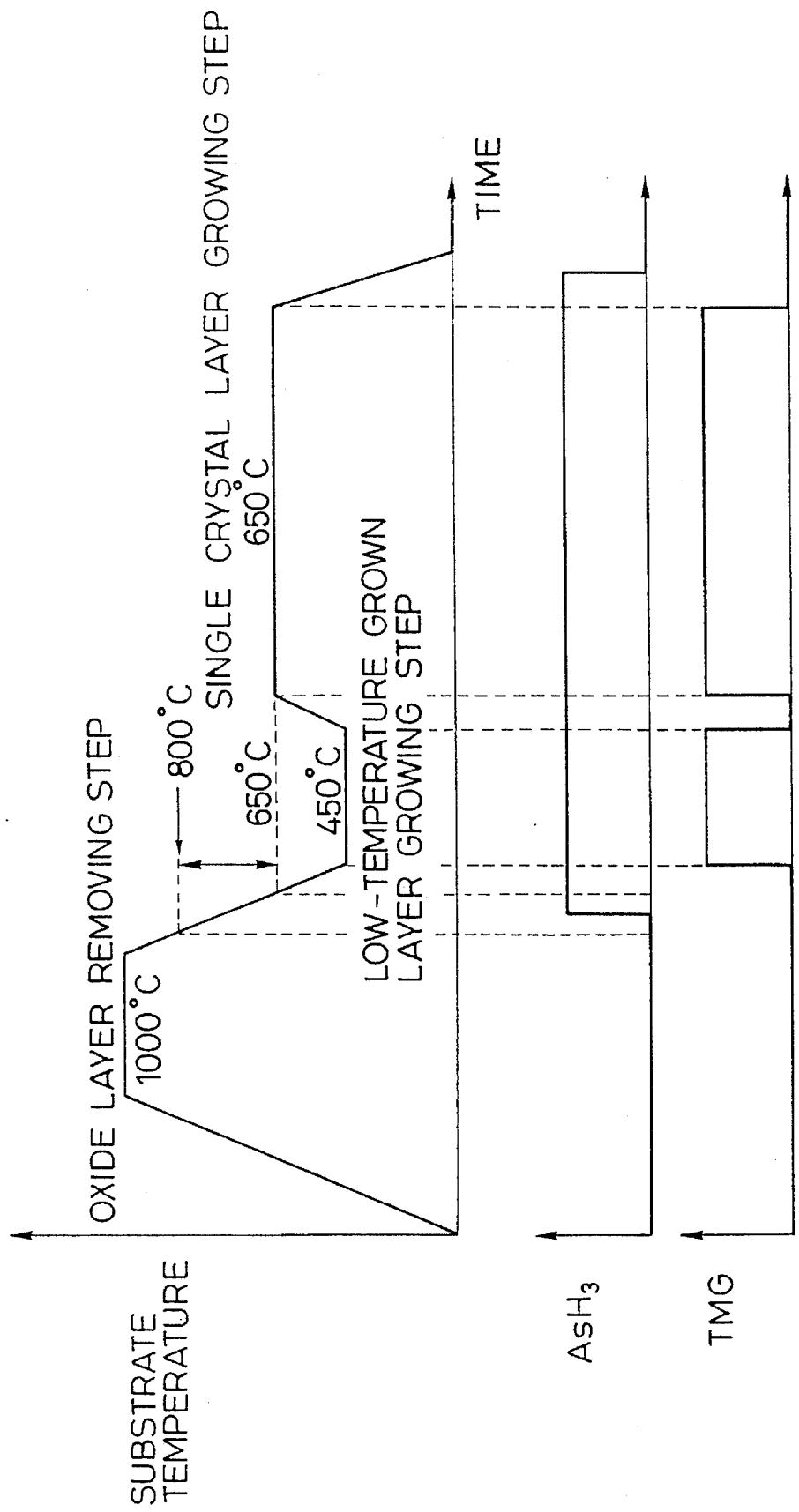
FIG. 1 is a view explaining a method of growing a compound semiconductor layer according to a first embodiment of the present invention.
Figure 2:
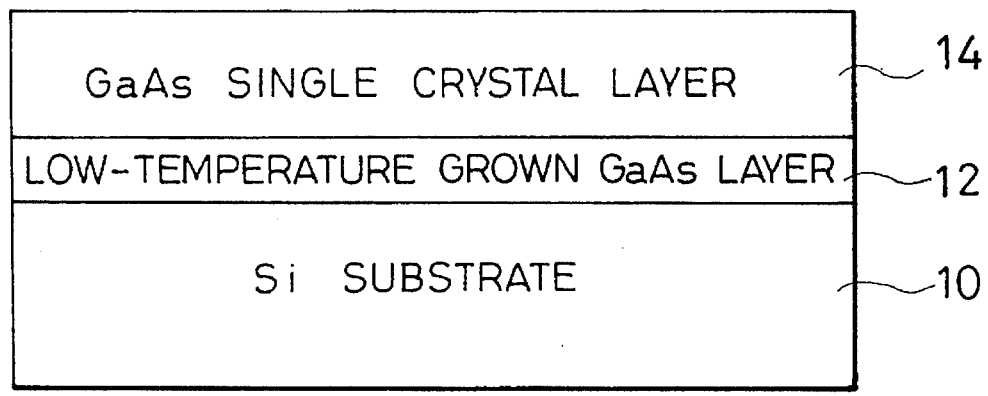
FIG. 2 is a view of compound semiconductor layers formed by the first embodiment of the present invention.

The method of growing a compound semiconductor crystal layer according to a first embodiment of the present invention will be explained.

In the present embodiment, a 4-inch-silicon substrate 10 offset by 2° from (100) plane in [011] direction was used, and GaAs layers 12, 14 of a Group III-V compound semiconductor was formed on the silicon substrate 10 by an MOCVD device.

In the present embodiment, while the compound semiconductor crystal layers were being grown, hydrogen gas was incessantly introduced into the reactor at a gas flow rate of 15.6 slm, and the pressure was 76 torr.

A temperature of the silicon substrate 10 was raised up to 1000° C. Then with the temperature maintained at 1000° C., the silicon substrate was heat-treated in an ambient atmosphere of a reducing gas, such as hydrogen gas, for about 10 minutes. Thus, an oxide layer on the surface of the silicon substrate 10 was removed (oxide layer removing step). Neither TMG (trimethyl gallium) as a source gas for Group III nor $AsH_3$ (arsine) as a source gas for Group V was introduced.

Subsequently the temperature was lowered from 1000° C. toward 450° C. which was a treatment temperature in the low-temperature grown layer forming step. The introduction of $AsH_3$ as a source gas for Group V was started at a time selected while the temperature was lowered from 1000° C. to 650° C. of the treatment temperature for the single crystal growing step. This is a characteristic of the present invention. In the present embodiment, $AsH_3$ as a source gas for Group V started to be introduced when the temperature arrived at 750° C. The $AsH_3$ flow rate was 50 sccm.

The temperature was further lowered with $AsH_3$ introduced. When the temperature arrived at 450° C., TMG as a source gas for Group III started to be introduced, and the formation of a low-temperature grown layer of GaAs was started on the silicon substrate 10. The flow rate of TMG gas as a source gas for Group III was 50 sccm. The flow rate ratio V/III of the source gas for Group V to the source gas for Group III was about 22. With the temperature retained at 450° C., $AsH_3$ and TMG were introduced for about 1.2 minutes, and a low-temperature grown layer 12 of an about 20 nm-thickness was formed on the silicon substrate 10.

Then, with $AsH_3$ introduced, the introduction of TMG was stopped. Subsequently the treatment temperature was raised. When the temperature arrived at 650° C. which was the treatment temperature of the single crystal growing step, the introduction of TMG as a source gas for Group III was resumed. The flow rate of $AsH_3$ as a source gas for Group V was 100 sccm, and the gas flow rate of TMG as a source gas for Group III was 14 sccm. The V/III ratio was about 40. With the temperature retained at 650° C., $AsH_3$ and TMG were introduced for only about 42.3 minutes, and a GaAs single crystal layer 14 of an about 3 μm-thickness was formed on the silicon substrate 10.

Then following the stop of the introduction of TMG, the temperature was lowered, and after the temperature had lowered to some extent, the introduction of $AsH_3$ was stopped, and the formation of GaAs layers 12, 14 on the silicon substrate 10 was finished.

Figure 3:
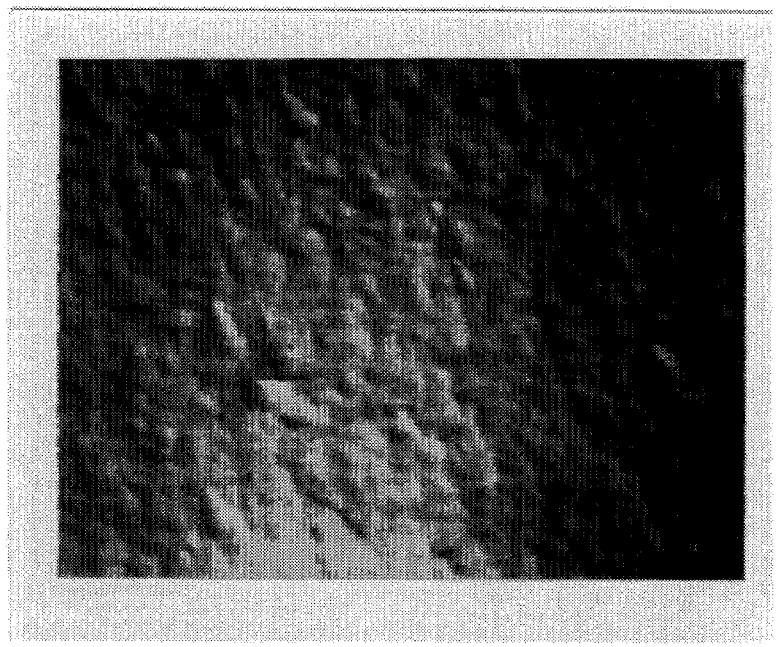
FIG. 3 is a picture by an optical microscope of the surface of a GaAs layer formed by the first embodiment of the present invention.
Figure 4:
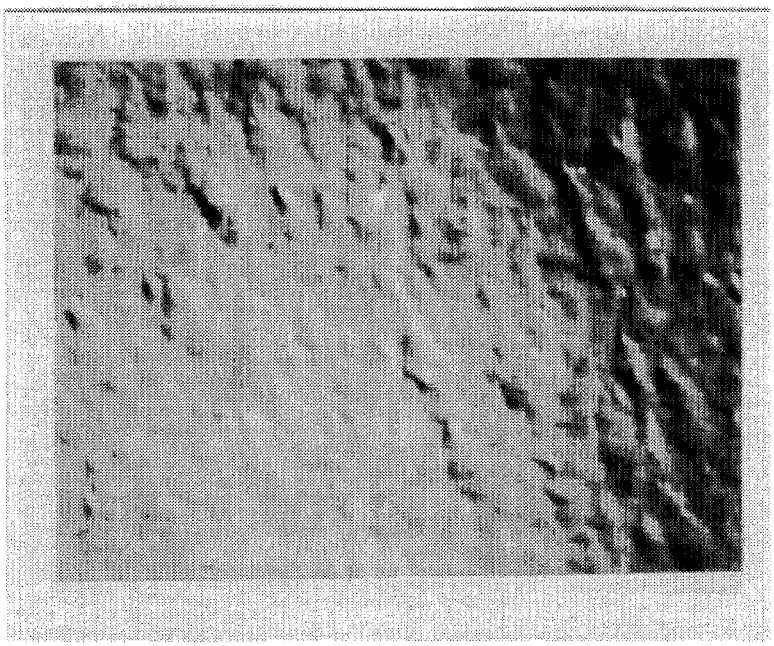
FIG. 4 is a picture by an optical microscope of the surface of a GaAs layer formed by the conventional method.

According to the method of growing compound semiconductor crystal layers according to the present embodiment, the contamination of the surface of the silicon substrate before the formation of the low-temperature grown layer could be prevented, and a GaAs layer having good crystal perfection and surface morphology could be formed. FIG. 3 is a picture by an optical microscope of the surface of the GaAs layer. For reference FIG. 4 shows a picture of an optical microscope of the surface of a GaAs layer formed by the conventional method described in Japanese Patent Laid-Open Publication No. 175690/1990. As apparent from the comparison between FIGS. 3 and 4, the surface of the GaAs layer formed by the present embodiment is found superior in the surface morphology to that formed by the conventional method.

To confirm the improved surface morphology and crystal perfection, a GaAs layer was grown, by the method of the present embodiment, on a silicon substrate offset from (100) plane in [011] direction. The GaAs layer was subjected to KOH treatment to form etch pits. It was found that most of the longitudinal axes of the etch pits formed in the GaAs layer were parallel with the offset direction of the silicon substrate, and the GaAs layer had improved surface morphology and crystal perfection.

The influence of the timing of the start of the introduction of AsH$_3$ as a source gas for Group V on the crystal perfection of the GaAs layers were studied. A GaAs layer was grown under the same conditions as in the above-described embodiment with only the temperature of the AsH$_3$ introduction starting temperature varied. Crystal states of the GaAs layer are shown in FIG. 5.

The GaAs layer includes, depending on a crystal state, "I-crystal" having an As-atom layer as the first layer, and a Ga-atom layer as the second layer, and "II-crystal" having a Ga-atom layer as the first layer and an As-atom layer as the second layer. The I-crystal is identified by the longitudinal axes of the etch pits formed therein by KOH treatment, which are normal to the offset direction. The II-crystal is identified by the longitudinal axes of the etch pits formed therein by KOH treatment, which are parallel with the offset direction.

It is known that the GaAs layer has better crystal perfection in the II-crystal than the I-crystal. This is because, in the II-crystal, the bonding between the Si of the silicon substrate and the Ga of the first layer is weak, and in addition the Si has no chemical bond with the As of the second layer, and accordingly lattice mismatching between the silicon substrate and the GaAs layer will be mitigated (M. Okumura, Y. Suzuki, K. Miki. K. Sakamoto, T. Sakamoto, S. Misawa and S. Yoshida, Journal of Vacuum Science Technology, vol. B7(3), p. 481, (1989)).

As shown in FIG. 5, in the cases that the AsH$_3$ introduction temperature is 1000° C. and 950° C., the entire surface of the GaAs crystal has the I-crystal, and in the cases that the temperature is 900° C. and 850° C., the crystals I and II are mixed. In the cases that the temperature is 800° C., 750° C., 700° C. and 650° C., the entire surface has the II-crystal. In the case that the temperature is 600° the I-crystal and the II-crystal are mixed. In the case that the temperature is 550° C., the entire surface has the I-crystal.

Thus, it was found that the AsH$_3$ introduction starting temperature is not started immediately after the oxide layer removing step, but between 800° C. to 650° C. which is the treatment temperature in the single crystal growing step, whereby a GaAs layer of the II-crystal having good crystal perfection could be obtained.

This will be because when the introduction starting temperature of AsH$_3$ as a source gas for Group V is higher than 875° C., the I-crystal with an As-atom layer as the first layer is formed because of strong zinc blend structure. Also this will be because when the introduction starting temperature of AsH$_3$ as a source gas for Group V is below 875° C., the bonding between the Si and Ga weak, and when the upper GaAs layer is formed, the first layer is replaced by the Ga-atom layer (N. Takagi, T. Eshita, S. Miyagaki, M. Kimura and K. Takasaki, Materials Research Science, vol, 259, p. 305 (1992)).

According to the present invention, the introduction of a V gas is started between the first oxide layer removing step and the second low-temperature grown layer forming step, and at a temperature lower than the first temperature and higher than the third temperature in the single crystal growing step, at which the first temperature arrives while being lowered to the second temperature. Accordingly the contamination of the silicon substrate surface before the formation of the low-temperature grown layer is precluded, and III-V compound semiconductor layers having good crystal perfection and surface morphology can be formed.

2. A second embodiment

The method of growing a compound semiconductor crystal layer according to a second embodiment of the present invention will be explained.

In the present embodiment, a 4-inch silicon substrate offset by 2° from (100) plane in [011] direction was used. A low-temperature grown layer 12 of GaAs as a Group III-V compound semiconductor, and three single crystal layers of GaAs 14a, 14b, 14c were formed on the silicon substrate 10 by an MOCVD device. In the present embodiment, the GaAs layers 12, 14a, 14b, 14c are formed on the silicon substrate by four steps, and this method is called "four-step growing method". The method by which the GaAs low-temperature grown layer 12, and one GaAs single crystal layer 14 are formed on the silicon substrate 10 is called "two-step growing method".

In the present embodiment, while the compound semiconductor crystal layers were being grown, hydrogen gas was incessantly introduced into a reactor at a gas flow rate of 15.6 slm, and the pressure was 76 torr.

A temperature of the silicon substrate 10 was raised up to 1000° C. Then with the temperature maintained at 1000° C., the silicon substrate was heat-treated in an ambient atmosphere of a reducing gas, such as hydrogen gas for about 10 minutes. Thus, an oxide layer on the surface of the silicon substrate 10 was removed (oxide layer removing step).

Subsequently, the temperature was lowered from 1000° C. to 400° C. which was the treatment temperature of the low-temperature grown layer forming step. After the temperature had been lowered, AsH$_3$ as a source gas for Group V was introduced at a flow rate of 400 sccm, and TMG as a source gas for Group III was introduced at a flow rate of 100 sccm. The V/III ratio was 15. With the temperature retained at 450° C., while AsH$_3$ and TMG were being introduced for about 1.2 minutes, the GaAs low-temperature grown layer 12 was formed in a thickness of about 10 nm on the silicon substrate 10.

Then the temperature was raised to 650° C. The AsH$_3$ gas flow rate was changed to 50 sccm, and the TMG gas flow rate was changed to 14 sccm, and the V/III ratio was changed to 13. With the temperature retained at 650° C., while AsH$_3$ and TMG were being introduced for about 10 minutes, a first GaAs single crystal layer 14a of a 0.5 μm-thickness was epitaxially grown.

The first GaAs single crystal layer 14a was formed at 650° C. within the range of about 600°–700° C., whereby corescence was suppressed, and the smoothness could be improved.

Then the temperature was raised to 700° C. The AsH$_3$ flow rate was changed to 100 sccm, and the TMG flow rate was changed to 14 sccm, so that the V/III ratio was raised to 27. With the temperature retained at 700° C., while AsH$_3$ and TMG were being introduced for 40 minutes, a second GaAs single crystal layer 14b of a 2.0 μm-thickness was epitaxially formed on the first GaAs single crystal layer 14a.

Subsequently the temperature was lowered to 650° C., while the AsH$_3$ and the TMG flow rates unchanged, AsH$_3$ and TMG were introduced for 10 minutes, and a third GaAs single crystal layer 14c of a 0.5 pm-thickness was epitaxially formed on the second GaAs single crystal layer 14b.

Then after the introduction of TMG was stopped, the treatment temperature was lowered, and after the temperature had been lowered to some extent, the introduction of AsH$_3$ was stopped, and the formation of the GaAs 12, 14a, 14b, 14c on the silicon substrate 20 was finished.

Figure 6:
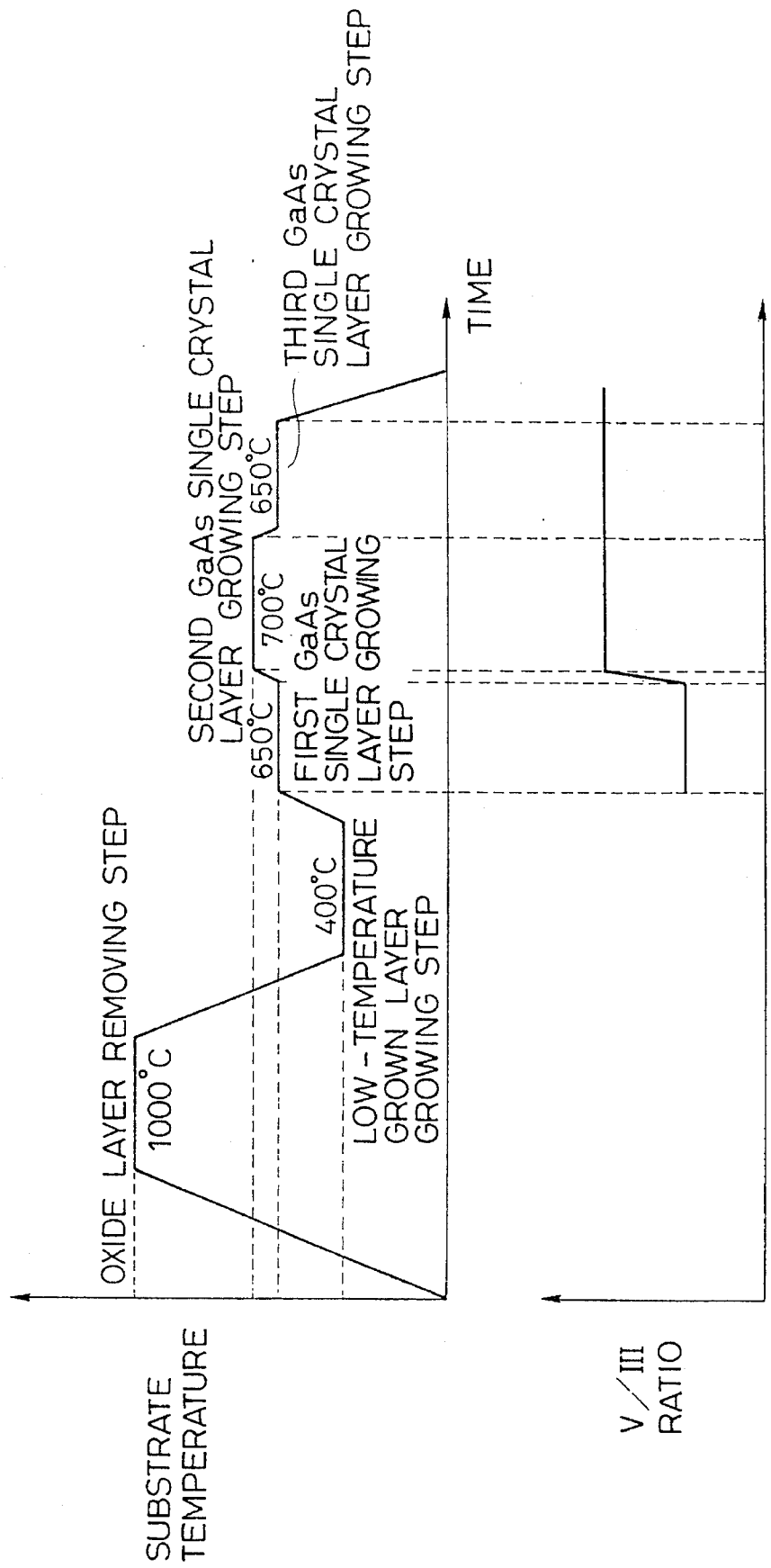
FIG. 6 is a view explaining a method of growing a compound semiconductor crystal layer according to a second embodiment of the present invention.
Figure 7:
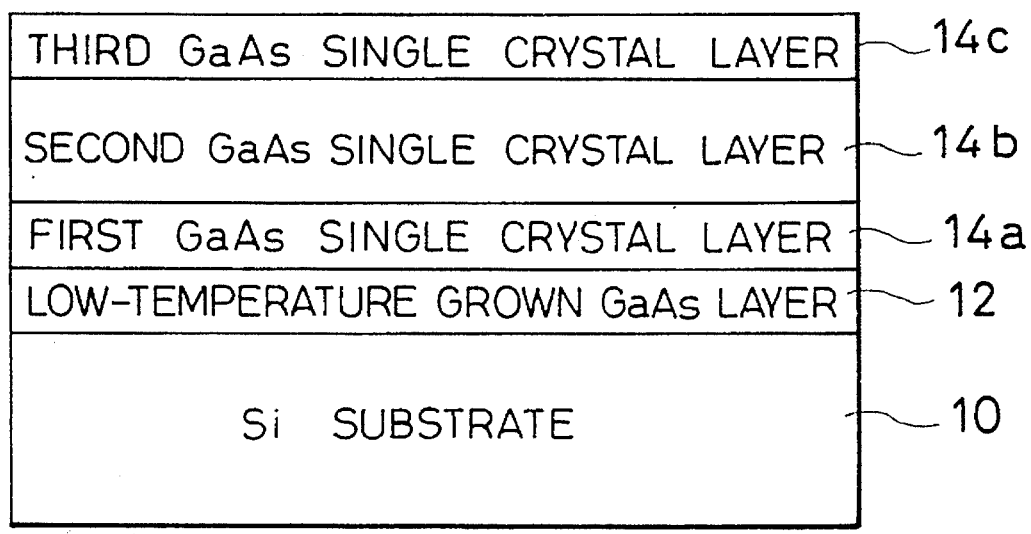
FIG. 7 is a view of compound semiconductor layers formed by the second embodiment of the present invention.
Figure 8:
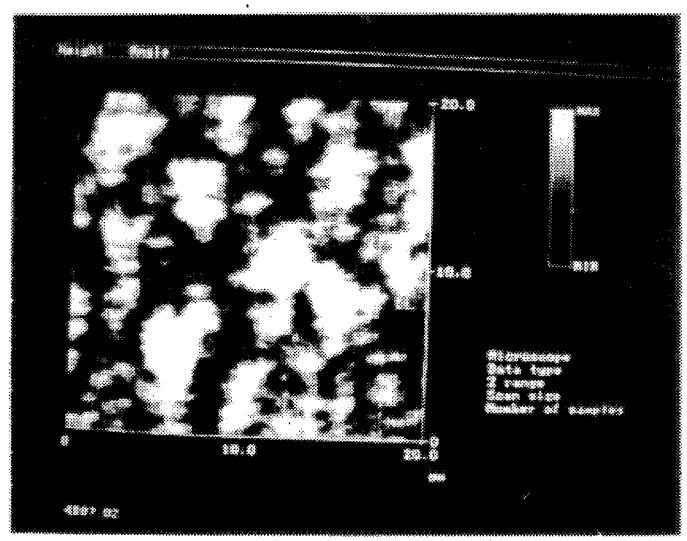
FIG. 8 is a picture by AFM of a GaAs layer formed by the second embodiment of the present invention.
Figure 9:
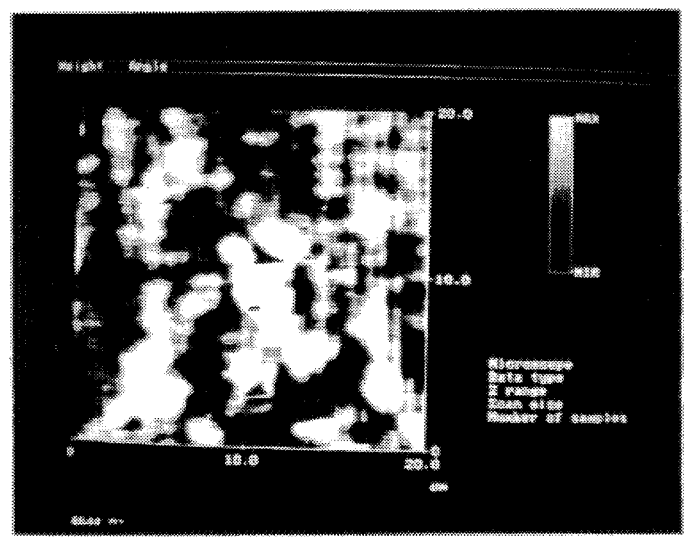
FIG. 9 is a picture by AFM of the surface of a GaAs layer formed by the conventional method.

FIG. 6 is a picture by AFM of the surface of the GaAs layer formed by the four-step growing method according to the present embodiment. For reference FIG. 9 shows a picture by AFM of the surface of a GaAs layer formed by the conventional two-step growing method. In the picture of FIG. 8 (the present invention) only 4 pits are found. In contrast, in the picture of FIG. 9 (prior art) pits as many as 20 are found.

The smoothness of the surface of the GaAs layers formed by the four-step growing method according to the present embodiment were measured.

Figure 10:
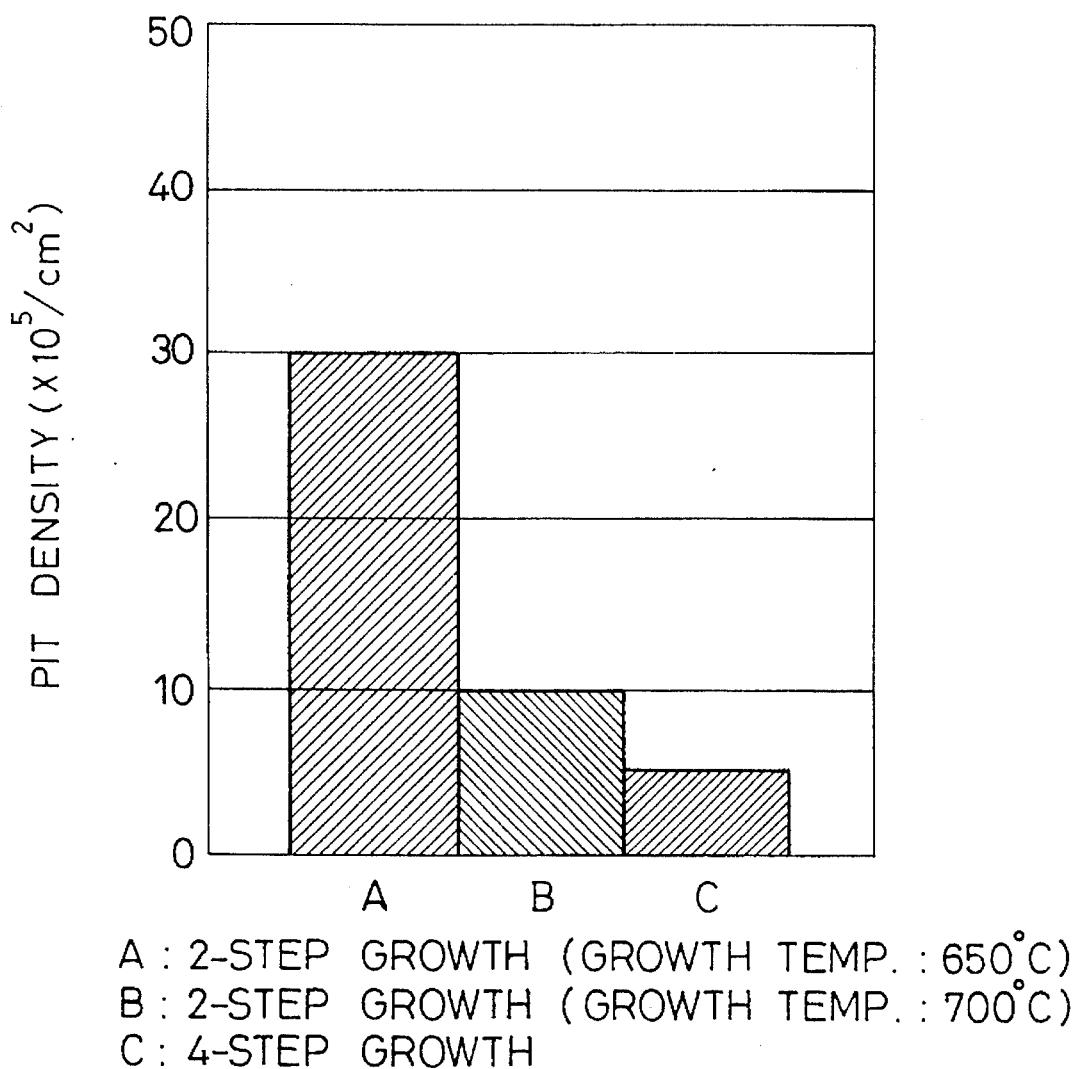
FIG. 10 is a graph comparing pit densities between the GaAs layers formed by the second embodiment of the present invention and the conventional method.
Figure 11:
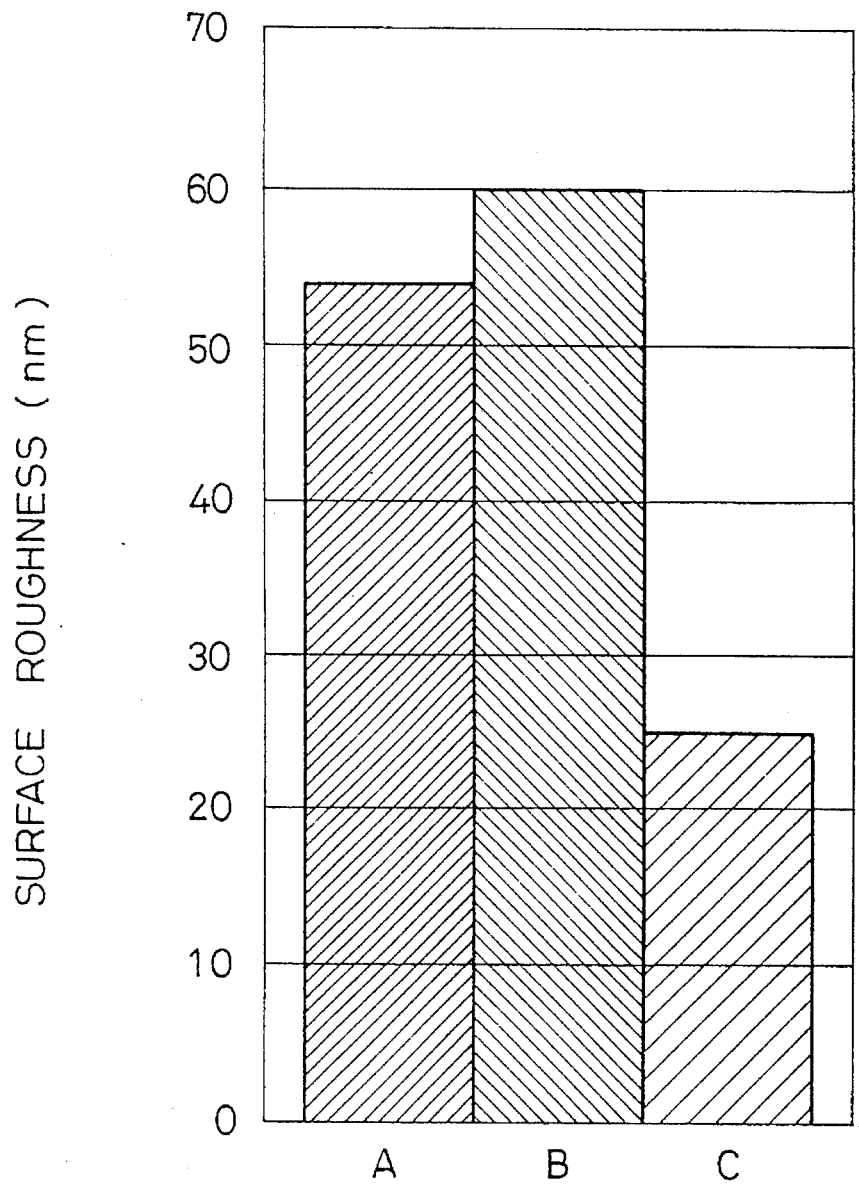
FIG. 11 is a graph comparing roughness values of the surfaces of the GaAs layers formed by the second embodiment of the present invention and the conventional method.
Figure 12:
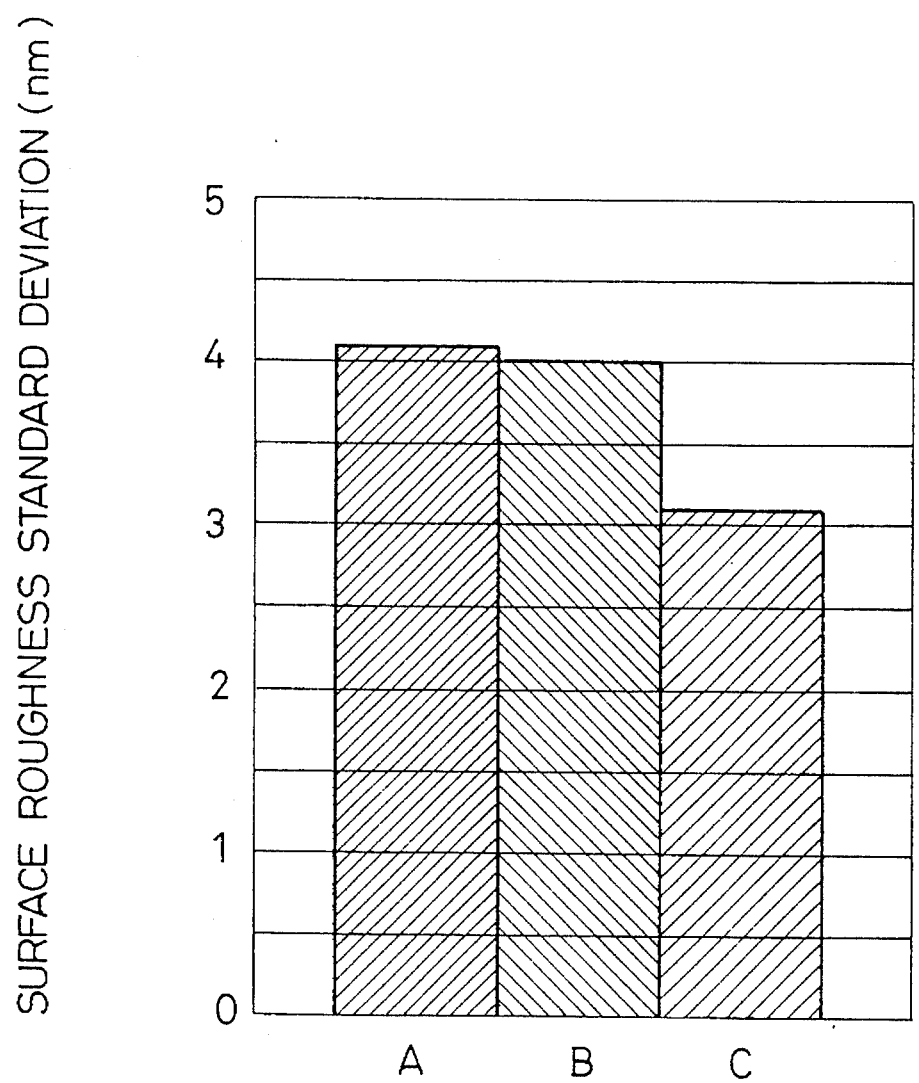
FIG. 12 is a graph of surface roughness standard deviation of the GaAs layers formed by the second embodiment of the present invention and the conventional method.

FIGS. 10 to 12 compare smoothness of the surfaces of the GaAs layers among the conventional two-step growing method (A: growing temperature: 650° C.), the conventional two-step growing method (B: growing temperature: 700° C.) and the four-step growing method of the present embodiment (C).

FIG. 10 shows pit densities of the GaAs surfaces. An pit density for the conventional method (A) is $30 \times 10^5$ cm$^{-2}$. In contrast to this, an pit density for the conventional method (B) is improved down to as much as $10 \times 10^5$ cm$^{-2}$. In the present embodiment (C), an pit density is further improved down to as much as $6 \times 10^5$ cm$^{-2}$.

FIG. 11 shows roughness measured by AFM of the GaAs surfaces. Roughness for the conventional method (A) is 54 nm, and roughness for the conventional method (B) is 60 nm. In contrast to this, roughness for the present embodiment (C) is 25 nm, which exhibits a drastic improvement.

FIG. 12 shows standard deviations of roughnesses measured by AFM of the GaAs layer surfaces. A standard deflection for the conventional method (A) is 4.1 nm, and that for the conventional method (B) is 4.0 nm. In contrast to this, a standard deviation for the present embodiment (C) is 3.1 nm, which exhibits an improvement.

Thus it is found that the smoothness of the GaAs layer formed by the conventional method (A) is poor, the conventional method (B) having a little improved the poor smoothness, but the present embodiment (C) has conspicuously improved the poor smoothness.

Figure 13:
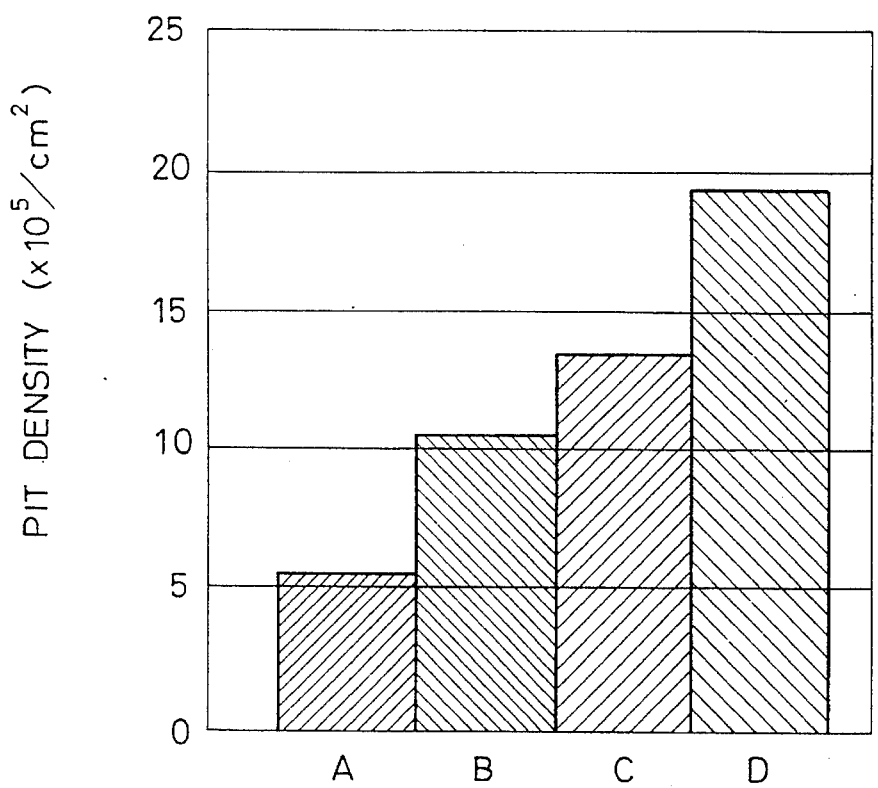
FIG. 13 is a graph of pit densities in the surface of the GaAs layer corresponding to different growth temperatures of the third GaAs single crystal layer in the second embodiment of the present invention.

Next, pit densities in the surface of the GaAs layers corresponding to different growth temperatures of the third uppermost GaAs single crystal layer 14c in the four-step growing method of the present embodiment are shown in FIG. 13.

As apparent from FIG. 13, as the growth temperature of the uppermost third GaAs single crystal layer is lowered, the pit density is decreased. It was observed that especially at a temperature lower than 700° C. a pit density was drastically decreased. Thus it is preferable that the fourth temperature of the uppermost third GaAs layer is low.

In the four-step growing method of the present embodiment, as shown in FIG. 6, the V/III ratio at which the first GaAs single crystal layer 14a is formed directly on the low-temperature grown layer 12 is lower than that at which the second GaAs single crystal layer 14b and the third GaAs single crystal are formed, whereby the surface morphology is improved. Surface roughness of the surface of the first GaAs single crystal layer 14a and pit density thereof were measured with the V/III ratio for forming the first GaAs single crystal layer 14a varied. The measured results are shown in FIG. 14.

Figure 14:
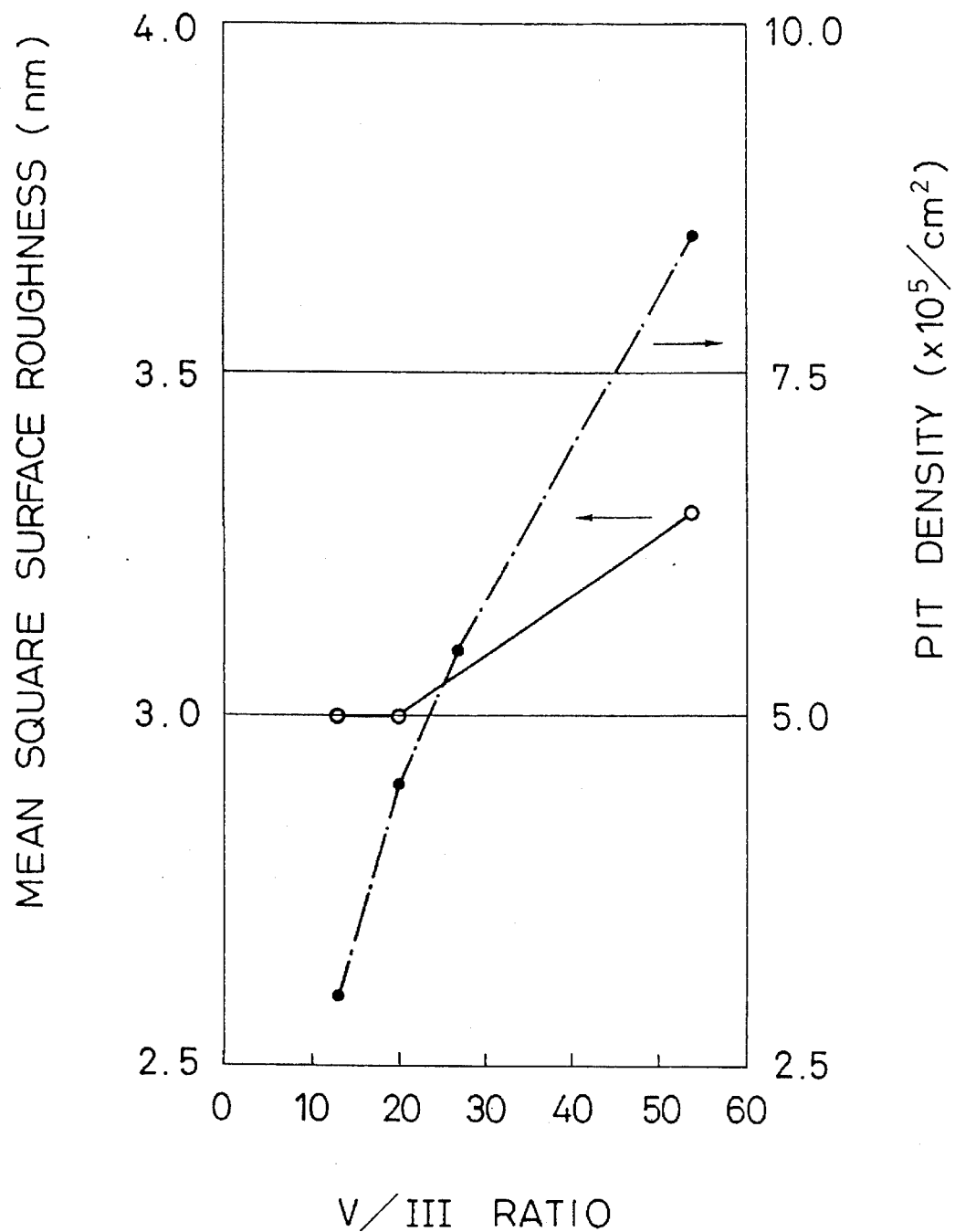
FIG. 14 is a graph comparing roughness of the surface of the GaAs layer and the pit density at different V/III ratios in the formation of the first GaAs single crystal layer in the second embodiment of the present invention.

As apparent from FIG. 14, the lower is the V/III ratio, the more improved are the mean square surface roughness and the pit density. This will be because the V/III ratio is lowered so as to prevent the agglomeration of the low-temperature grown layer 12.

In connection with the V/III ratio for forming the GaAs single crystal layer on a silicon substrate there is a report that when the GaAs single crystal layer is formed at a low V/III ratio, the surface morphology is deteriorated (S. Nozaki, N. Noto, T. Egawa, A. T. Wu, T. Soga and T. Jimbo, Japanese Journal of Applied Physics, vol. 29, No. 1, January 1990, pp 138–144). But the inventors of the present application have found that low V/III ratios for forming the first GaAs single crystal layer 14a improve the surface morphology.

The present embodiment can provide a substrate for growth having on the surface a heteroepitaxial layer of a compound semiconductor on the surface which has few pits, good surface smoothness, and a low carrier concentration. The present invention can much contribute to practical use of high-speed semiconductor devices using compound semiconductors.

3. A third embodiment

The method of growing a compound semiconductor crystal layer according to a third embodiment of the present invention will be explained with reference to FIG. 15.

In the present embodiment a GaAs layers is formed on a silicon substrate by an MOCVD. The silicon substrate is offset by 2° from (001) plane in [110] direction. Trimethyl gallium (TMG) was used as a Group III material. Arsine (AsH$_3$) or tertiarybutylarsine (TBAs, (CH$_3$)$_3$CAsH) was used as a Group V material.

Figure 15:
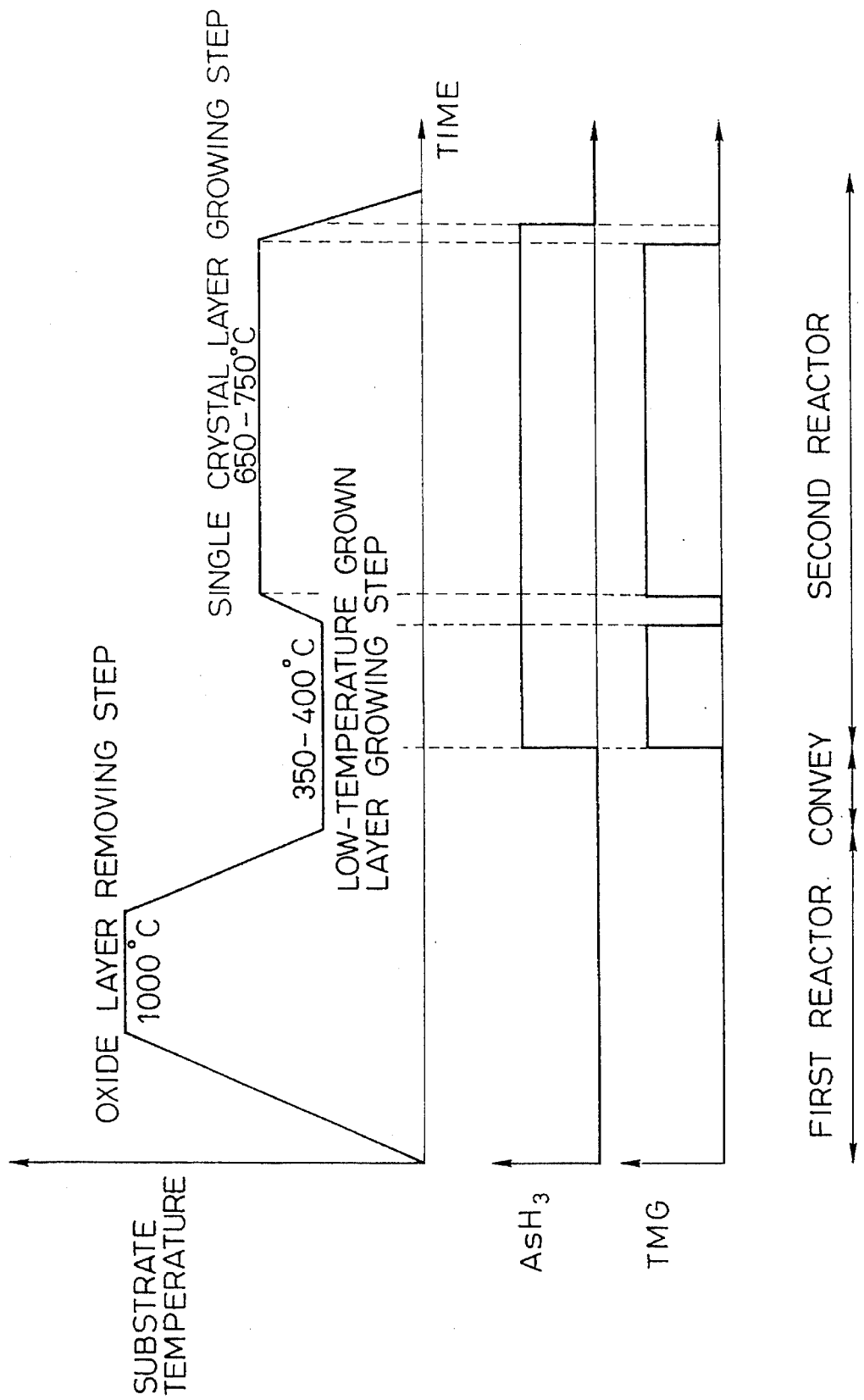
FIG. 15 is a view explaining the method of growing compound semiconductor crystal layers according to a third embodiment of the present invention.

In the present embodiment, as shown in FIG. 15, GaAs low-temperature grown layers are formed on the silicon substrate, and then a GaAs single crystal layer was grown. The so-called two-step growing method was used.

First, about 12 slm of hydrogen gas was introduced into the first reactor to make a hydrogen ambient atmosphere. A temperature of the silicon substrate was raised to about 1000° C. At 1000° C. the silicon substrate was heat-treated for 10 minutes to remove a natural oxide layer, etc. formed on the surface of the silicon substrate. At this time, the atmosphere in the reactor was H$_2$ gas alone, and a source gas for Group V was not introduced.

Then the temperature of the silicon substrate is lowered to 350°–450° C. The silicon substrate was conveyed from the first reactor to the second reactor. Subsequently about 50 sccm of a source gas for Group V was introduced into the second reactor, and after 5–15 minutes the introduction of the source gas for Group V was increased to about 400 sccm while about 18 sccm of TMG was introduced. A GaAs initial layer of a 5–20 nm-thickness was grown at the low temperature.

In this example and controls, crystal perfection and surface smoothness of the GaAs layer were measured for different V group gasses, at different introduction temperatures, and at different growth temperatures of the low-temperature grown initial layer. The measured results are shown in FIGS. 16 to 18.

The crystal perfection was appreciated based on full-widths at half maximum (FWHM) of X-ray rocking curves given by double crystal X-ray spectrometry. Smaller values indicate better crystal perfection. The surface smoothness was appreciated by mean square of roughness (field: 50 μm) by AFM. Smaller values indicate better surface smoothness.

FIG. 16 shows the measured results. FIG. 17 is a graph of the crystal perfection of the simple crystal layer at different growth temperatures of the low-temperature grown layer. FIG. 18 is a graph of the smoothness of the single crystal layer at different growth temperatures of the low-temperature grown initial layer. In FIGS. 17 and 18 the curve (A) is for the case where AsH$_3$ is used as a V group gas. The curve (B) is for the case where TBAs was used as a V group gas.

Figure 17:
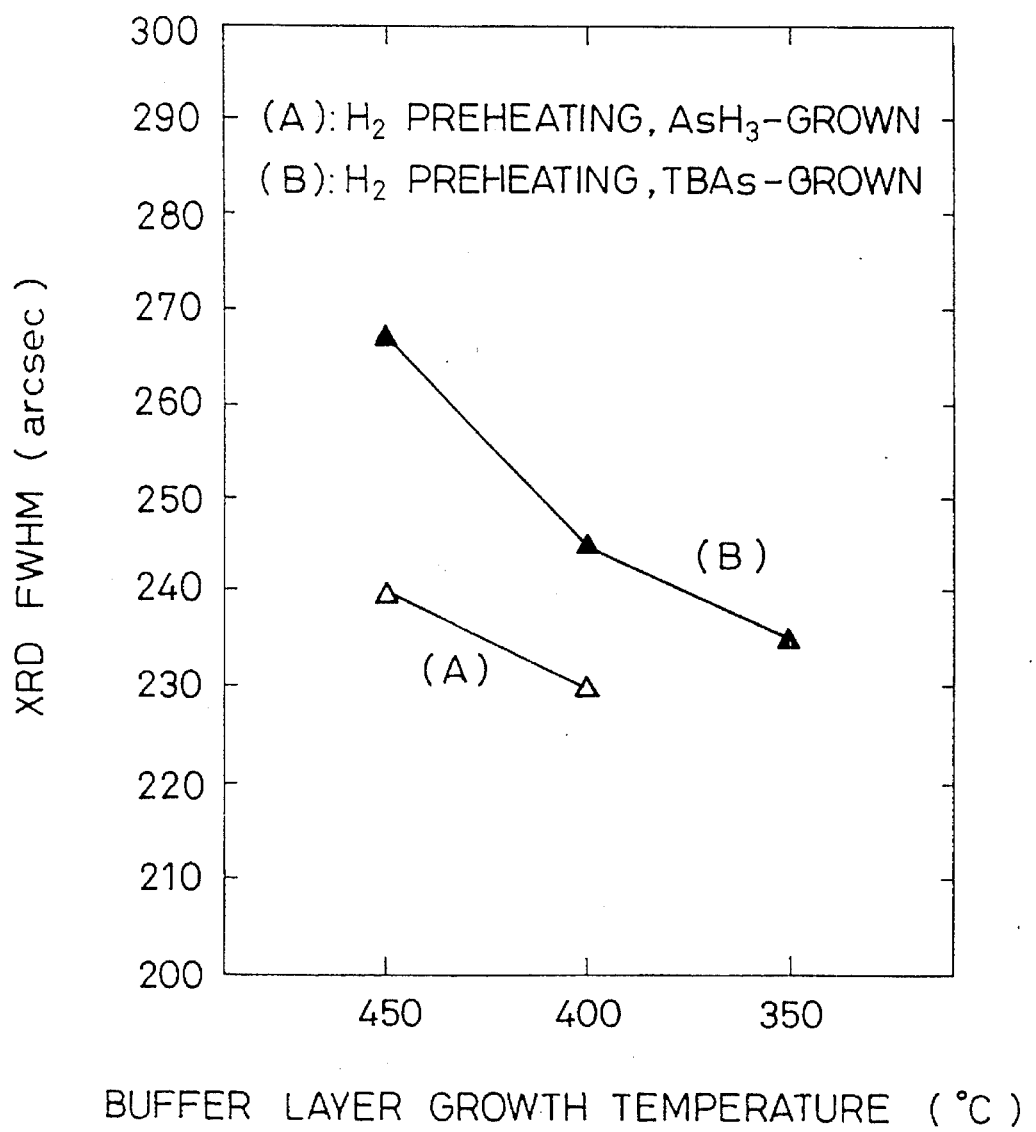
FIG. 17 is a graph of crystal perfection corresponding to growth temperatures of the low-temperature grown layer in the third embodiment of the present invention.
Figure 18:
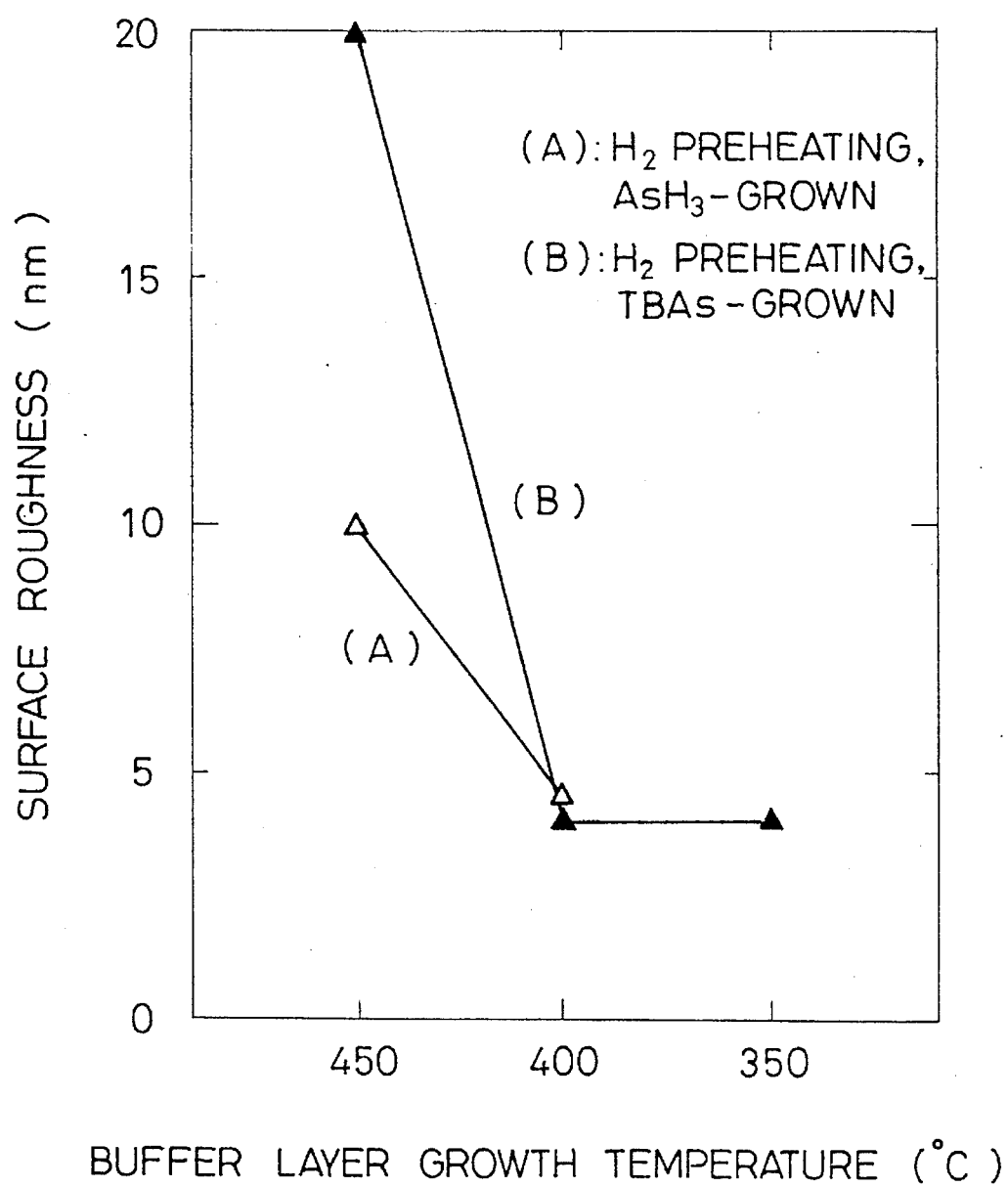
FIG. 18 is a graph of the surface roughness corresponding to growth temperatures of the low-temperature grown layer in the third embodiment of the present invention.

As apparent from FIGS. 16 to 18, in Comparative Examples 1 and 2 where the introduction temperature of the V group gasses were lowered from 1000° C. which was used in the conventional two-step growing method to 450° C., whereby the crystal perfection is improved, but the surface smoothness is degraded. In contrast to this, in Examples 1 to 3, the low-temperature grown initial layer was grown at a low temperature below 400° C. while the introduction temperature of the V group gas was lowered below 400° C., whereby the crystal perfection can be improved while the surface smoothness can be made satisfactory.

As the source gas for Group V, TBAs is preferable to AsH$_3$, because the former improves the crystal perfection and the surface smoothness.

According to the present embodiment, although the source gas for Group V is introduced at a temperature lower than the epitaxial growth temperature of the GaAs single crystal layer, the surface morphology is not degraded, as is in the conventional method of growing compound semiconductor crystal layers. This is because separate reactors were used respectively for the step of removing natural oxide layer, etc. on the silicon substrate at a temperature as high as 1000° C., and for the step of growing the GaAs low-temperature grown initial layer and the GaAs single crystal layer. Contaminations which have floated in the oxide layer removing step do not adhere to the silicon substrate.

According to the present embodiment, Group III-V compound semiconductor layers having good crystal perfection and surface morphology can be formed on a silicon substrate.

4. Other embodiments

The present invention is not limited to the above-described embodiments and can cover various modifications.

For example, in the above-described embodiments, as a Group III-V compound semiconductor GaAs was formed on a silicon substrate, but the method of the present invention is applicable to the formation of the following Group III-V compound semiconductors: e.g., GaP, GaSb, AlAs, AlP, AlSb, InAs, InP, InSb, etc.; three component mixed crystals, such as $Al_xGa_{1-x}As$, $Al_xGa_{1-x}P$, $Al_xGa_{1-x}Sb$, $In_xGa_{1-x}As$, $In_xGa_{1-x}P$, $In_xGa_{1-x}Sb$, $In_xAl_{1-x}As$, $In_xAl_{1-x}P$, $In_xAl_{1-x}Sb$, $GaAs_xP_{1-x}$, $GaAs_xSb_{1-x}$, $GaP_xSb_{1-x}$, $AlAs_xP_{1-x}$, $AlAs_xSb_{1-x}$, $AlP_xSb_{1-x}$, $InAs_xP_{1-x}$, $InAs_xSb_{1-x}$, $InP_xSb_{1-x}$, etc.; four component mixed crystals, such as $Ga1_{-x}Al_xAs_{1-y}P_y$, $Ga_{1-x}Al_xP_{1-y}Sb_y$, $Ga_{1-x}Al_xAs_{1-y}Sb_y$, $In_{1-x}Al_xAs_{1-y}P_y$, $In_{1-x}Al_xP_{1-y}Sb_y$, $In_{1-x}Al_xAs_{1-y}Sb_y$, $In_{1-x}Ga_xAs_{1-y}P_y$, $In_{1-x}Ga_xP_{1-y}Sb_y$, $In_{1-x}Ga_xAs_{1-y}Ab_y$, $(Ga_{1-x}Al_x)_yIn_{1-y}P$, $(Ga_{1-x}Al_x)_yIn_{1-y}As$, $(Ga_{1-x}Al_x)_yIn_{1-y}Sb$, $Al(As_{1-x}P_x)_ySb_{1-y}$, $Ga(As_{1-x}P_x)_ySb_{1-y}$, $(n(As_{1-x}P_x)_ySb_{1-y}$, etc.; and others.

In the above-described embodiments, AsH$_3$, which is a hydrogen compound, was used, but in place AsCl$_3$, which is a chlorine compound, may be used. As Group V gasses of P and SbPH$_3$ and SbH$_3$, which are hydrogen compounds, may be used. PCl$_3$, SbCl$_3$ and SbCl$_4$, which are chlorine compounds, may be used.

As source gasses for Group V, vapor of solid As, solid P and solid Sb may be used.

What is claimed is

1. A method of growing a layer of a III-V compound semiconductor on a silicon substrate comprising:

an oxide layer removing step of removing an oxide layer on a surface of the silicon substrate at a first temperature;

a low-temperature grown layer forming step of forming a low-temperature grown layer of the III-V compound semiconductor on the silicon substrate while introducing a source gas for Group III and a source gas for Group V at a second temperature lower than the first temperature; and a single crystal layer growing step of growing a single crystal layer of the Group III-V compound semiconductor on the low-temperature grown layer while introducing the source gas for Group III and the source gas for Group V at a third temperature higher than the second temperature and lower than the first temperature, the introduction of the source gas for Group V being started between the oxide layer removing step and the low-temperature grown layer forming step and at a fourth temperature lower than the first temperature and higher than the third temperature, at which the first temperature arrives while being lowered to the second temperature, the fourth temperature being above 650° C. and below 800° C.

2. A method according to claim 1, wherein the first temperature is above about 950° C. and below about 1050° C., the second temperature is above about 350° C. and below about 500° C., and the third temperature is above about 600° C. and below about 750° C.

3. A method according to claim 1, wherein the oxide layer removing step, the low-temperature grown layer forming step and the single crystal layer growing step are conducted in a same reactor.

4. A method of growing a layer of a Group III-V compound semiconductor on a silicon substrate comprising:

an oxide layer removing step of removing an oxide layer on a surface of the silicon substrate at a first temperature;

a low-temperature grown layer forming step of forming a low-temperature grown layer of the Group III-V compound semiconductor on the silicon substrate while introducing a source gas for Group III and a source gas for Group V at a second temperature lower than the first temperature;

a first single crystal layer growing step of growing a first single crystal layer of the Group III-V compound semiconductor on the low-temperature grown layer while introducing the source gas for Group III and the source gas for Group V at a third temperature higher than the second temperature and lower than the first temperature;

a second single crystal layer growing step of growing a second single crystal layer of the Group III-V compound semiconductor on the first single crystal layer while introducing the source gas for Group III and the source gas for Group V at a fourth temperature higher than the third temperature and lower than the first temperature; and a third single crystal layer growing step of growing a third single crystal layer of the Group III-V compound semiconductor on the second single crystal layer while introducing the source gas for Group III and the source gas for Group V at a fifth temperature higher than the second temperature and lower than the fourth temperature.

5. A method according to claim 4, wherein the third temperature is above about 600° C. and below 700° C., the fourth temperature is above about 700° C., and the fifth temperature is below about 700° C.

6. A method according to claim 4, wherein a V/III ratio which is a flow rate ratio of the source gas for Group V to the source gas for Group III in the first single crystal layer forming step is lower than V/III ratios which are flow rate ratios of the source gas for Group V to the source gas for Group V in the second and the third single crystal growing steps.

7. A method according to claim 5, wherein a V/III ratio which is a flow rate ratio of the source gas for Group V to the source gas for Group III in the first single crystal layer forming step is lower than V/III ratios which are flow rate ratios of the source gas for Group V to the source gas for Group V in the second and the third single crystal growing steps.

8. A method according to claim 5, wherein the oxide layer removing step, the low-temperature grown layer forming step, the first single crystal layer growing step, the second single crystal layer growing step, and the third single crystal layer growing step are conducted in a same reactor.

9. A method of growing a layer of a Group III-V compound semiconductor on a silicon substrate comprising:

an oxide layer removing step of removing an oxide layer on a surface of the silicon substrate at a first temperature;

a low-temperature grown layer forming step of forming a low-temperature grown layer of the III-V compound semiconductor on the silicon substrate while lowering the first temperature to a second lower temperature of below 400° C., then starting an introduction of a source gas for Group V, and subsequently starting additionally an introduction of a source gas for Group III; and a single crystal layer growing step of growing a single crystal layer of the Group III-V compound semiconductor on the low-temperature grown layer at a third temperature higher than the second temperature and lower than the first temperature while introducing the source gas for Group III and the source gas for Group V.

10. A method according to claim 9, wherein the third temperature is above about 600° C. and below about 750° C.

11. A method according to claim 9, wherein the oxide layer removing step is conducted in a first reactor, the low-temperature grown layer forming step and the single crystal layer growing step are conducted in a second reactor.

12. A method according to claims 1, wherein the source gas for Group V is a hydrogen compound of Group V.

13. A method according to claims 4, wherein the source gas for Group V is a hydrogen compound of Group V.

14. A method according to claims 9, wherein the source gas for Group V is a hydrogen compound of Group V.

15. A method according to claims 1, wherein the source gas for Group V is a chlorine compound of Group V.

16. A method according to claims 4, wherein the source gas for Group V is a chlorine compound of Group V.

17. A method according to claims 9, wherein the source gas for Group V is a chlorine compound of Group V.

18. A method according to claim 1, wherein the source gas for Group V is vapor of Group V in solid state.

19. A method according to claim 5, wherein the source gas for Group V is vapor of Group V in solid state.

20. A method according to claim 9, wherein the source gas for Group V is vapor of Group V in solid state.

* * * * *

UNITED STATES PATENT AND TRADEMARK OFFICE
CERTIFICATE OF CORRECTION

PATENT NO. : 5,492,860

DATED : February 20, 1996

INVENTOR(S) : Satoshi OHKUBO et al.

It is certified that error appears in the above-indentified patent and that said Letters Patent is hereby corrected as shown below:

Column 1, line 7, after "growing" insert --a layer--;

line 11, after "good" insert --crystal--;

line 12, after "as" insert --high-speed--;

line 13, after "semiconductor" insert --materials,--;

line 27, after "crystal" insert --layers,--; and line 30, change "IXI-V" to --III-V--.

Column 4, line 20, change "A1" to --Al--; and line 37, change "singlecrystallized" to --single-crystallized--.

Column 11, line 34, change "$In_xAl_{1-x}As$" to --$In_xAl_{1-x}As$--;

line 35, change "$AlAs_xP_{1-x}$" to --$AlAs_xP_{1-x}$--;

line 40, change "$(Ga_{1-x}Al_x)$" to --$(Ga_{1-x}Al_x)$--;

line 41, change "$(n(AS_{1-}$" to --$(In(AS_{1-}$--; and

UNITED STATES PATENT AND TRADEMARK OFFICE
CERTIFICATE OF CORRECTION

PATENT NO. : 5,492,860

DATED : February 20, 1996

INVENTOR(S) : Satoshi OHKUBO et al.

It is certified that error appears in the above-indentified patent and that said Letters Patent is hereby corrected as shown below:

Column 11, line 43, change "$AsH_3$ ," to --$AsH_3$,--.

Signed and Sealed this

Fourteenth Day of May, 1996

BRUCE LEHMAN

Attest:

Attesting Officer

Commissioner of Patents and Trademarks